United States Patent [19]

Parmet

[11] 4,135,158
[45] Jan. 16, 1979

[54] UNIVERSAL AUTOMOTIVE ELECTRONIC RADIO

[75] Inventor: Bernard S. Parmet, Park Ridge, Ill.

[73] Assignee: Motorola, Inc., Schaumburg, Ill.

[21] Appl. No.: 583,343

[22] Filed: Jun. 2, 1975

[51] Int. Cl.² ............................................. H04B 1/06
[52] U.S. Cl. ................................................... 325/317
[58] Field of Search .............. 325/315, 316, 355, 430, 325/451, 459, 460, 317, 307, 419, 346, 349, 423, 396, 489; 360/78; 340/324 PP; 331/1 A, 1 R, 18, 25

[56] References Cited

U.S. PATENT DOCUMENTS

| | | | |
|---|---|---|---|
| 3,108,230 | 10/1963 | Hurtig | 325/349 X |
| 3,238,460 | 3/1966 | Enloe | 325/489 X |
| 3,348,155 | 10/1967 | Recklinghausen | 325/451 |
| 3,544,899 | 12/1970 | Gusyatinsky et al. | 325/346 |
| 3,611,154 | 10/1971 | Kupfer | 325/459 |
| 3,611,347 | 10/1971 | Gingell | 340/334 |
| 3,628,146 | 12/1971 | Beckman et al. | 325/315 |
| 3,633,134 | 1/1972 | Barrows et al. | 325/489 |
| 3,665,318 | 5/1972 | Hoffman et al. | 325/460 X |
| 3,665,507 | 5/1972 | Peil | 325/315 |
| 3,667,045 | 5/1972 | Combs | 325/355 X |
| 3,748,581 | 7/1973 | Yello | 325/316 X |
| 3,828,257 | 8/1975 | Puskas | 325/423 X |
| 3,835,384 | 9/1974 | Liff | 325/419 X |
| 3,851,254 | 11/1974 | Merrell et al. | 325/455 |
| 3,864,637 | 2/1975 | Kanow | 331/1 A X |
| 3,878,467 | 4/1975 | Manson | 325/316 |
| 3,883,807 | 5/1975 | Alberkrack | 325/459 |
| 3,895,303 | 7/1975 | Imazeki et al. | 325/460 X |
| 3,913,140 | 10/1975 | Iijima | 360/78 |
| 3,949,240 | 4/1976 | Saito et al. | 325/396 |
| 3,976,943 | 8/1976 | Cipher et al. | 325/317 |

FOREIGN PATENT DOCUMENTS 241602 6/1960 Australia .................... 325/315

OTHER PUBLICATIONS

"MOSFETs for Tubes", A. D. Helfrick, *QST For*, Dec. 1969, pp. 28–31.

Primary Examiner—Robert L. Griffin
Assistant Examiner—Aristotelis M. Psitos
Attorney, Agent, or Firm—James P. Hamley; James W. Gillman

[57] ABSTRACT

Selected radio circuits are fabricated on modules which plug into a "mother" board located in the radio chassis. The circuitry includes a plurality of RF front ends (including at least one AM and one FM front end), each tunable over a selected radio band by tuner circuitry. The AM front end includes a saturable core reactor whose tuning inductance varies as a function of the tuning current provided to it by a voltage-to-current converter in the tuner.

Both AM and FM signals are translated by a frequency synthesizer to a common IF frequency, namely 10.7 MHz. The synthesizer employs a quartz crystal controlled oscillator feeding a phase lock loop whose frequency is varied via the tuning control. Quartz crystal filters for AM, and ceramic filters for FM provide required selectivity. As all signals are at the same IF, a common IF amplifier is employed. Further, a single phase lock loop is adapted to demodulate both AM and FM signals.

The resultant demodulated signals are amplified, and tone shaped, via D. C. voltage controlled audio processor circuitry. The audio circuitry is adapted to accept auxiliary inputs, such as the output of a tape player.

A digital display senses tuner status providing frequency read out. Additional provisions allow switching the display to read out tape player status, or to provide a time display from an electronic clock.

57 Claims, 7 Drawing Figures

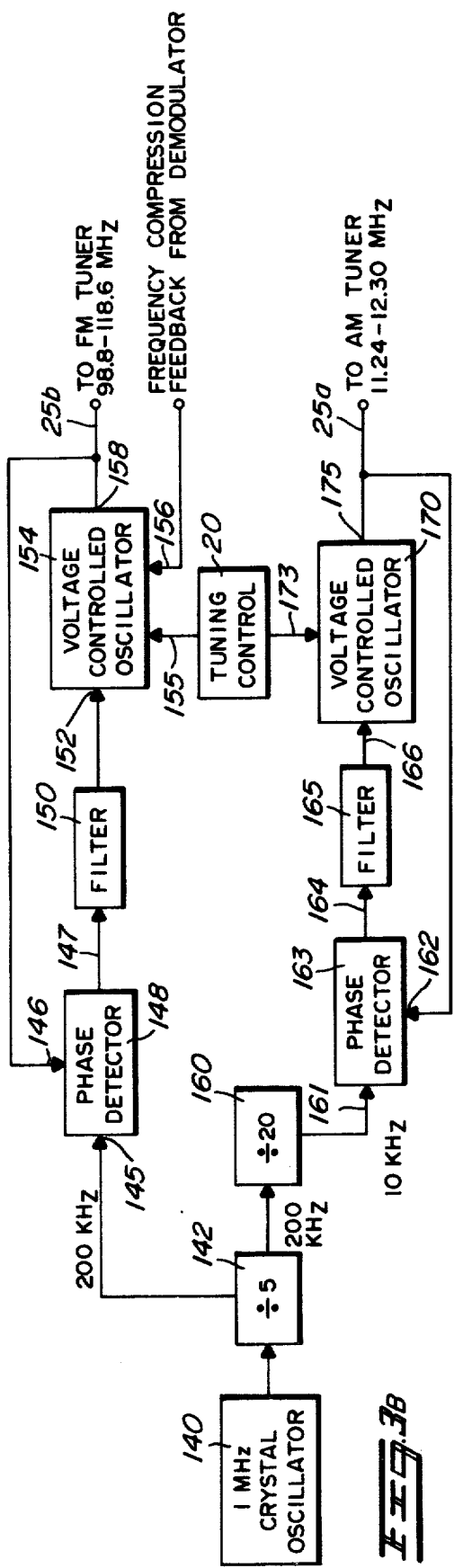
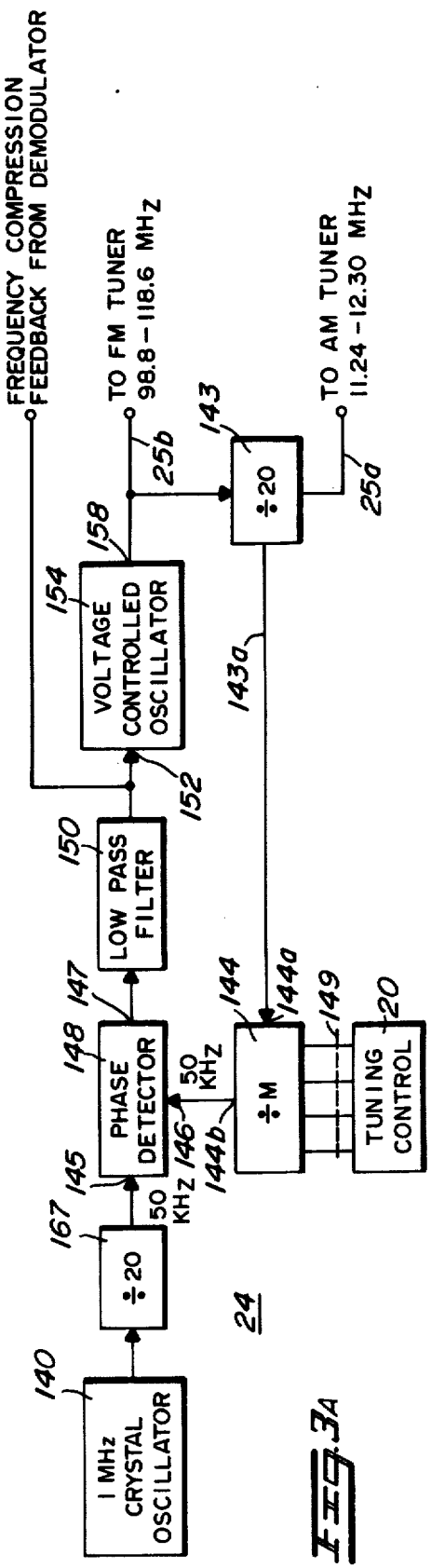

UNIVERSAL AUTOMOTIVE ELECTRONIC RADIO

BACKGROUND OF THE INVENTION

This invention relates to automotive radio receivers and, more particularly, to improvements in the same.

Radios designed to mount in the dashboard of an automobile are commonplace. Because the radios are mounted in a limited space, they must be highly compact. Further, due to their mobile nature, such radios must have stringent circuit performance in order to handle the variable signal conditions they will encounter. Moreover, the automotive radio industry is highly competitive and the market place demands a reliable yet inexpensive product. The conflicting requirements of performance and size versus cost have forced the manufacturer to make serious tradeoffs. His ultimate design, invariably, involves numerous sacrifices.

In addition, altering an existing radio design to provide different or additional features has proved difficult. Rather than add FM circuitry to an existing AM radio design, manufacturers have had to redesign the entire radio to be AM/FM compatible. Modification of an existing radio designed for operation in the United States to the European system has similarly proved difficult.

The most troublesome part of a conventional car radio is the mechanical tuner. Commonly, such tuners employ slug tuned coils. A mechanical linkage transfers rotational actuation of the tuning knob to a lateral translation of cores within the slug tuned coils, and also provides approximate indication of tuning frequency. Such tuners are quite bulky and, as they are mechanical, have reliability problems. These problems are multiplied when push button type programmed tuning is desired. In addition automotive radios have been clumsy to operate. Proper tuning of all radios is critical, and, in a moving environment such tuning is difficult. To overcome these problems mechanical "automatic search" systems have been developed. These systems have proved to be bulky, expensive, and unreliable.

Due to advances in solid state technology, it is becoming increasingly more feasible to replace mechanical systems with their more reliable electronic counterparts. Advances such as large scale integration of active electronic devices in extremely compact integrated circuit form allow designers options not available heretofore. Further, "all electronic" systems allow modular "plug in" type designs, rendering a more easily serviceable and alterable product.

OBJECTS OF THE INVENTION

It is an object of the present invention, therefore, to provide a more compact, higher performance, all electronic automotive radio using state of the art technology.

It is a further object of the invention to provide an all electronic radio of the above described type which provides fully automatic, precision tuning.

Another object of the invention is to provide an all electronic radio of the above described type which includes a precision digital readout, which readout is adaptable to display the frequency to which the radio is tuned as well as the status of a tape deck or real time.

It is a further object of the invention to provide an all electronic radio of the above described type which is composed of a series of unit plug in modules, whereby radio alteration or service is effected by replacing a particular module.

Briefly, a fully electronic radio, according to the instant invention, comprises a plurality of input RF front ends. Included is at least one AM front end and one FM front end. Each front end includes an RF filter which is tunable over a desired band to pass selected signals in that band. A band switch provides fully electronic switching to select a desired front end. The output of the selected front end is translated to a single predetermined intermediate frequency via a frequency variable translator. Both the RF front ends, and the translator are synchronously varied via a tuning control. Since all signals are converted to a single intermediate frequency, a common intermediate amplifier is employed. Thereafter, a single phase lock loop decoder demodulates both the AM and FM signals to baseband audio signals. These audio signals are further processed through audio reproduction means, which means are voltage variable to alter the amplitude and tone characteristics of the audio signal. The resultant signals are transduced to audibility.

BRIEF DESCRIPTION OF THE DRAWINGS

FIG. 3A is a detailed block diagram of the synthesizer;

FIG. 3B is a detailed block diagram of an alternative synthesizer;

DETAILED DESCRIPTION OF A PREFERRED EMBODIMENT OF THE INVENTION

The invention is better understood with reference to the figures wherein common numbers for the same or similar items have been used throughout to more clearly depict the preferred embodiment of the invention.

Figure 1:
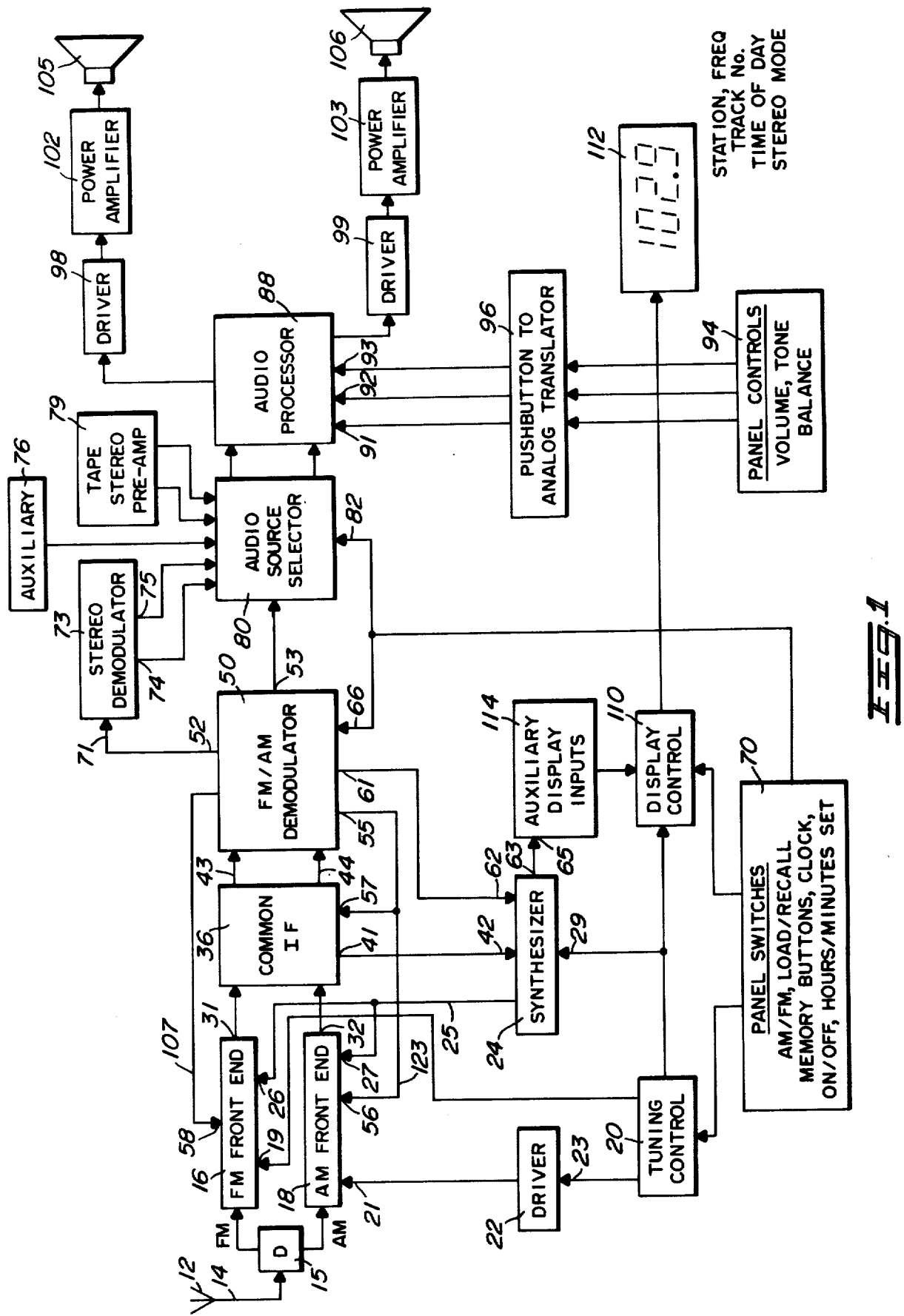
FIG. 1 is a block diagram of an AM/FM radio according to the invention.

Referring to FIG. 1, a universal electronic radio according to the invention is shown in block form. An antenna 12 collects broadcast RF signals and conducts them via line 14 to the diplexer 15. The diplexer contains low and high pass filters routing the FM band signals to the FM front end 16, and the AM signals to the AM front end 18. A bandswitch control acts through a tuning control 20 to activate a selected front end 16 or 18. The front ends 16, 18 are more fully discussed with reference to FIG. 2, however each contains an RF filter which is electronically tunable over a desired band to pass selected signals. In the preferred embodiment, the tuning component in the FM filter is a reverse biased silicon junction diode whose capacitance changes in a predetermined way as a function of a control voltage applied at front end terminal 19 by tuning control 20. The AM tuning element is a saturable core reactor whose inductance changes as a function of current applied at AM front end terminal 21 via a voltage-to-current driver 22 which also receives a tuning control signal at its input 23.

A synthesizer 24, discussed more fully with reference to FIG. 3, connects to mixers located within each front end. Line 25 connects the synthesizer 24 to the FM front end at terminal 26, and to the AM front end at terminal 27. The synthesizer 24 is a tunable oscillator, which derives its tuning signal from the tuning control 20 at synthesizer input terminal 29. In response to signals from the tuning control 20, the synthesizer 24 produces signals of predetermined frequency which, when mixed with the front end signals, produce an output at each front end 16, 18 centered at a single intermediate frequency. In the preferred embodiment, the synthesizer 24 signal translates the FM front end signals to 10.7 MHz, the resultant signal appearing at the FM front end output terminal 31, and, similarly, translates the AM front end signals to the same intermediate frequency, i.e. 10.7 MHz, the resultant signal appearing at the AM front end output terminal 32.

While the preferred embodiment illustrates only two front ends, it should be understood that any number of front ends could be used. Other desirable front end bands might include short wave, weather information, long wave and the like. Further, while the preferred embodiment converts each front end to the same IF frequency, it should be understood that an embodiment which up-converts the AM band to obtain the image rejection benefits described hereinbelow also falls within the scope of the invention even if a common IF is not used. Moreover, while the preferred embodiment employs a crystal stabilized synthesizer to produce the local oscillator frequencies, it should be understood that a device according to the instant invention might use conventional local oscillator circuitry.

As the front end outputs are all at a single predetermined intermediate frequency, each may be processed through a common IF stage 36. The IF stage contains filters, centered about the intermediate frequency, which provide tuning selectivity. Also, a common IF amplifier is used for all input signals. In addition, in applications wherein another local oscillator stabilization technique is desired, e.g. conventional local oscillator designs, the common IF could include a crystal discriminator, centered at the IF, which produces an output feedback signal at output terminal 41 coupling to the synthesizer at the synthesizer terminal 42. This feedback assures that the synthesizer translates the front end signals to precisely the predetermined intermediate frequency. The common IF 36 provides a first output for AM signals at 43 and a second output for FM signals at 44. These outputs 43, 44 are applied to a common phase lock loop FM/AM demodulator 50. The demodulator 50, which is more fully described with reference to FIG. 5, acts in one mode to decode FM signals, reproducing them at the FM demodulator output terminal 52. In a second mode it demodulates the AM signals reproducing these signals at the AM demodulator output 53. In addition, the demodulator provides an output AGC signal at AGC output 55 which is fed back both to the AM front end at terminal 56 and to the common IF AGC terminal 57. This feedback signal controls an attenuator located within the AM front end which acts to limit the signal amplitude applied to the front end mixer, and similarly controls an attenuator located in the common IF. Similarly a demodulator 50 output on line 107 provides an AGC control signal to the FM tuner AGC input 58. Also, a signal is produced at the demodulator output 61 which is applied to the synthesizer input 62 whereby frequency compression is achieved, as is more fully described hereinbelow.

Electronic switches located within the demodulator 50, which are used to select either the AM or FM mode of demodulation, are controlled at the demodulator input 66 by the panel switches indicated generally at 70. The panel switches are manually operable from the front of the radio receiver. In the instant embodiment, the switches allow a radio user to select either the AM or FM band, to select a pre-programmed tuning frequency, to actuate a tuning scan mode, to adjust the setting of an internal clock, and to turn the radio on or off.

The FM output terminal 52 of the demodulator couples to the input 71 of a stereo demodulator 73. In a well known manner, the stereo demodulator 73 decodes the stereo FM signal and produces a left channel output at terminal 74 and a right channel output at terminal 75. These channels, along with an audio signal from an auxiliary source 76, and the audio outputs from a stereo tape deck 79, all feed into an audio source selector 80. The source selector 80 is comprised of a series of electronic switches, all of which are controlled via signals from the panel switches 70 to the source selector control terminal 82.

The source selector 80 routes selected audio inputs to the audio processor 88. The processor includes internal circuitry which varies the amplitude and frequency characteristics of input signals in response to DC control voltages applied at the processor inputs 91, 92 and 93. The control signal inputs originate at the front panel controls 94 which, as shown, are operable to set volume, tone, and balance. These panel controls are connected to a pushbutton to analog translator 96 which in turn provides DC control voltages at processor inputs 91, 92 and 93 suitable for achieving the required amplitude, balance, and tone processing. In an alternative embodiment the panel controls 94 may comprise controls having a direct analog output, e.g. potentiometers, thus obviating the need for translator 96. Thereafter, the audio signals couple to left and right drivers 98, 99 respectively; the drivers couple to power amplifiers 102, 103 and thereafter the signals are transduced to audibility via speakers 105, 106 respectively.

A display control 110 produces at a read out 112 a digital display representative of a parameter status such as the frequency to which the radio is tuned. The display control 110 is comprised or processing circuitry and readout driver circuitry. An input signal to the control 110, for example an input from tuning control 20, is selected from panel switch grouping 70 and is predeterminedly scaled and processed to activate selected readout drivers, which drivers in turn activate corresponding segments of the readout. In the preferred embodiment the readouts are of the seven segment light emitting diode type, but it should be understood that other types, such as liquid crystal, or plasma discharge devices may be used. Such display and display control circuitry is well known in the art, as, for example, in digital voltmeter applications. The display control 110 may be provided with switching to allow an auxiliary display input 114, such as an electronic clock, to be fed into the display control thereby reading out the input parameter, such as time, on the digital display 112. Where the synthesizer 24 utilizes a high stability crystal oscillator, the oscillator output can be used as the time base for the clock, thus providing extreme timing accuracy. For the preferred embodiment wherein the auxiliary input is a clock, the oscillator output 63 is shown coupled to the auxiliary input 65. Also, the display control might sense the status of a tape player, whereby the readout might indicate the track number of the tape being played.

As can be seen, the overall universal electronic radio-entertainment center is of a very flexible design, allowing countless inputs, outputs, and display modes. Further, since virtually all radio functions are realized by all electronic circuitry, a unique radio mechanical construction is employed. The radio is comprised of a chassis or "mother board", having module receiving connectors interconnected corresponding to given radio functions. Selected circuits are fabricated on plug-in "sister board", modules. These modules may be individually tested and aligned. Thus, it is seen that the basic radio may be altered, or repaired, simply by replacing a given module. For example, altering a radio designed to operate in the U.S. AM band for operation in a European band would simply require replacing certain modules with their European counterparts. A further advantage to the all-electronic design is that componentry may be in integrated circuit form and thus the radio can be fabricated in a very small volume, yet being highly reliable in use.

Figure 2:
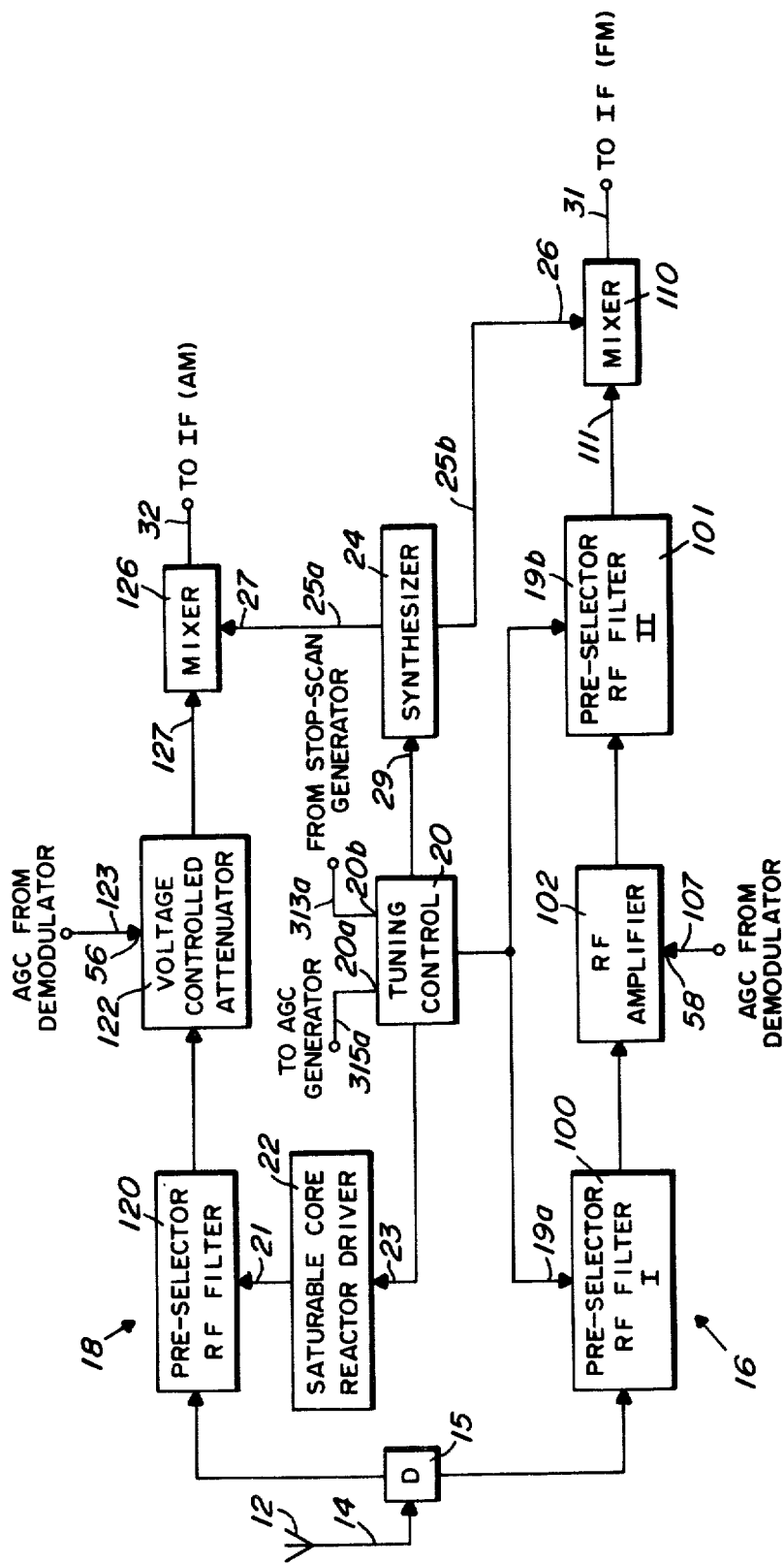
FIG. 2 is a detailed block diagram of the AM and FM front ends.

FIG. 2 illustrates the elements of the tuner of the universal electronic radio. RF signals received at antenna 12 are passed via line 14 to the diplexer 15. The diplexer 15 separates AM from FM signals, passing the FM signals to the FM tuner 16, and the AM signals to the AM tuner 18. The FM front end 16 has a pair of RF filters 100, 101. Each filter is comprised of a reverse biased silicon diode whose tuning capacitance varies predeterminedly in response to a tuning signal applied at the preselector filter terminals 19a, 19b, respectively, from the tuning control 20. The filters act to pass selected frequencies to subsequent radio circuitry. The output of the first preselector RF filter 100 passes to an RF amplifier 102. The RF amplifier 102 is of conventional design, having an AGC input terminal 58 fed via line 107. Variable voltages at the AGC input 58 alter the gain characteristics of the amplifier 102, whereby the dynamic range of signals applied to the mixer 110 is kept within the mixer's normal range. Further selection is accomplished by the second filter 101, and, thereafter the signal is passed to the first input 111 of the mixer 110. The mixer has a second input 26 which connects to the synthesizer 24 output via line 25b. In response to signals from the tuning control 20 applied to synthesizer input 29 the synthesizer produces a signal of predetermined frequency which is suitable for translating the FM selected frequency to a common IF, in this case 10.7 MHz. The mixer output, at 31, leads to the common IF amplifier of the radio.

In the preferred embodiment, the FM mixer 110 is comprised of a MOSFET, having first and second gates, a drain, and a source. Coupled to the first gate is the output from the second RF filter 101, available at input 111. The synthesizer 24 via line 25b couples to the second gate at terminal 26, and the drain couples to the line output 31. The MOSFET's source is coupled to a reference potential. It is known in the art that MOSFETs are excellent mixers, having a wide dynamic range input and providing controlled mixing at the output.

AM signals couple directly from the diplexer 15 to the AM RF filter 120. The filter 120 is comprised of a saturable core reactor whose tuning inductance varies as a function of the current signal provided to it, at the filter input terminal 21, from the saturable core reactor driver 22. The output from the tuning control 20 is a DC voltage which is not suitable for the proper driving of the reactors. Therefore, the reactor driver 22 takes the DC voltage from the tuning control 20, at driver input 23, converting it to a corresponding DC current suitable for reactor tuning. Selected frequencies in the AM band are passed from the AM RF filter 120 to a voltage controlled attenuator 122. AGC voltages, from the AM demodulator, on attenuator 122 AGC input line 123 at terminal 56 vary the degree of attenuation of the attenuator 122 whereby the AM mixer 126, which couples to the voltage controlled attenuator output, is not overloaded. The AM mixer 126 employs an FET having a gate, a source, and a drain. The gate couples to the voltage controlled attenuator output at terminal 127, the source couples to the synthesizer 24 via mixer input 27, and the drain couples to the mixer output on line 32. Signals from the synthesizer respond to tuning control signals whereby the selected AM signals applied to the mixer first input 127 are translated to the common IF frequency, namely 10.7 MHz. As is known in the art, an FET mixer accepts wide dynamic range input signals producing a controlled mixed output.

Unlike conventional radios, there is no RF amplification of the AM signals prior to the mixer. Further, preselector RF filter 120 does not have the narrow band pass normally associated with AM front end filters. Because radio selectivity is primarily determined by later circuits, front end circuitry in the universal electronic radio is not as critical as in standard designs.

The tuning control 20 has several modes of operation. First, it is responsive to panel switches whereby depression of a panel switch causes the tuning control to vary its output tuning signals thus tuning the receiver to different frequencies. Further, the tuning control has the capability of storing programmed tuning signals whereby the radio user may simply push a button which he has programmed to correspond to a selected radio station, and the tuner automatically recalls the proper tuning signal from its memory, applying the signal to the appropriate RF front end.

In the manual scan mode, the operator depresses a control and the radio automatically scans the frequencies in the band until it sequences to the desired received station, at which time the control is released, and the radio locks to the desired station. In an automatic scan mode the control is manually activated once and the tuner automatically tunes and locks the radio to a subsequently received station.

When tuning is instituted the AGC circuitry, described with reference to FIG. 5, must be disabled. Therefore, tuning control 20 produces an AGC disable pulse at output 20a, which is coupled to the AGC generator, at the beginning of a tuning sequence.

A stop scan generator, which is also discussed with reference to FIG. 5, senses that a station is received and transmits a stop pulse to tuning control input 20b, via line 313a, which causes the tuning control to cease sequencing, thus locking the radio onto the frequency of the received station.

The tuning control 20, and preferably the synthesizer 24, are fabricated in integrated circuit form. The control 20 contains addressable storage registers which, via control 20 internal switching, allow user programming. The digital stored information corresponds to the analogue voltage which, when applied to the synthesizer 24 and front ends 16, 18 automatically tunes the radio to the preprogrammed stations. Digital-to-analogue conversion is accomplished via any suitable digital-to-analogue converter known in the prior art. The control 20 includes further circuitry responsive to front panel switches which cause a discrete increase (or decrease, depending upon whether the up-scan or down-scan button is depressed) analogue output voltage sequencing the synthesizer and the front ends to an adjacent station. Such circuitry may be realized by conventional up-down counters and digital-to-analogue converters well known in the prior art. While the tuning control 20 is complex to build, it should be appreciated that one skilled in the art has sufficient knowledge to build such circuitry which switch and store digital signals, thereafter converting them to a desired analogue voltage.

FIG. 3A illustrates the preferred embodiment of the synthesizer 24. A crystal oscillator 140 produces output pulses at a 1 MHz rate stable to within ± 0.002%. These pulses contain harmonics of the fundamental 1 MHz frequency. A divider 167 divides the oscillator output by twenty, applying the resultant 50 Khz and its harmonic signals to input 145 of phase detector 148. Phase detector 148 has a pair of inputs 145, 146 and a controlled output 147. Internal circuitry in phase detector 148 causes its output 147 to assume a DC voltage representative of the phase difference between signals applied to the inputs 145, 146. Phase detector output 147 couples to a low pass filter 150 which removes any high frequency components from the phase detector output, thereafter passing the filtered DC signal to input 152 of the voltage controlled oscillator 154. Internal circuitry in controlled oscillator 154 causes its output oscillating frequency to vary in response to the DC voltage at its input 152. Also coupled to oscillator input 152 is a frequency compression feedback signal, which is more fully discussed hereafter. The voltage controlled oscillator output 158 couples to line 25b which connects to the FM mixer portion of the FM tuner.

Voltage controlled oscillator output 158 also couples to the input of a second divider 143. This divider divides signals at its input by a factor of twenty reproducing the output at a first line 25a which couples to the AM mixer portion of the AM tuner, and at a second line 143a which connects to the input 144a of a programmable divider 144. Programmable divider 144 has a series of control inputs which couple via lines 149 to tuning control 20. Divider output 144b connects to the phase detector 148 second input 146. Programmable divider 144, via internal circuitry, acts to reproduce at its output 144b the signal at its input 144a divided in frequency by a modulus M. The modulus M is programmable via binary coded decimal signals applied from the tuner 20 via lines 149 to the divider's control input terminals.

Phase detector 148, low pass filter 150, voltage controlled oscillator 154, divider 143, and programmable divider 144 act as a conventional phase lock loop. Phase detector 148 produces a DC voltage at its output 147 which represents the error in phase lock between the crystal divided signal at its first input 145, and the return loop signal at its second input 146. This DC error voltage is filtered by low pass filter 150, thereafter being applied to voltage controlled oscillator control terminal 152. In response to the DC voltage at its input 152, the voltage controlled oscillator internal circuitry varies the frequency of oscillation at its output 158. This output frequency is then divided first by divider 143 and then by divider 144 being applied back at the phase detector second input 146. The loop feedback will assure that the phase detector's first and second inputs 145, 146 ultimately phase lock, assuring that the frequency at second input 146 equals a multiple of the divided crystal oscillator frequency. Since the frequency on line 25b is equal to the frequency at phase detector second input 146 times (20 × M), it is apparent that by changing the modulus M, a predetermined frequency may be selected on line 25b. The produced frequency sequence in selected multiples of 50 Khz increments, responsive to the changing modulus, in order to satisfy the properties of the phase lock loop.

Since the FM band ranges from 88 to 108 MHz, with interstation spacings of 200 Khz, the synthesizer 24 must produce output frequencies tunable over a range of 98.8 to 118.6 MHz, in 200 Khz increments, to properly translate the FM band signals to the predetermined IF frequency of 10.7 MHz. Thus, the voltage controlled oscillator 154 is designed to nominally operate in the 100 MHz range. In response to binary coded decimal tuning control signals the programmable divider 144 alters its modulus M whereby the frequencies at output line 25b are caused to jump in the required 200 Khz increments over the desired FM band range. In this manner, the synthesizer produces discrete frequency outputs, each of which is at a proper spacing to tune the receiver to authorized FM stations.

As the AM broadcast band is from 535 to 1605 Khz, with interstation spacing of 10 Khz, the AM synthesizer output must be tunable over a range from about 11.24 to 12.30 MHz to properly translate the AM base band to the predetermined IF frequency of 10.7 MHz. As described above, the output line 25b, in response to a changing modulus M of divider 144, jumps in 200 Khz increments. These 200 Khz increments are divided by twenty by divider 143 resulting in 10 Khz increments on line 25a, which are suitable for the AM interstation spacings. Thus in the AM mode the tuning control 20 programs programmable divider 144 whereby frequencies over the desired range are selected in precise 10 Khz increments.

FIG. 3B illustrates, in fundmental building block form, an alternative embodiment of synthesizer 24. A crystal oscillator 140 produces output pulses at a 1 MHz rate stable within ± 0.002%. These pulses contain harmonics of the fundamental 1MHz frequency. A first divider 142 divides the crystal output by 5, applying the resultant 200 Khz fundamental signal, and its harmonics, to the FM phase lock loop phase detector input 145. The FM phase lock loop contains a phase detector 148 having a first input 145, a second input 146, and an output 147. Internal circuitry in the phase detector 148 causes its output 147 to assume a DC voltage representative of the phase difference between signals applied to the inputs 145, 146. The phase detector 148 couples to a low pass filter 150 which removes any high frequency components from the phase detector output, thereafter passing the filtered DC signal to an input 152 of the voltage controlled oscillator 154. The voltage controlled oscillator 154 has a series of inputs 152, 155 and 156, each of which is coupled to the oscillator's internal circuitry whereby a signal at an input varies the frequency of the oscillator signal at the output 158. The oscillator output 158 couples back to the phase detector second input 146. Applied to oscillator input 155 is the output from the tuning control 20. Applied to voltage controlled oscillator input 156 is a frequency compression feedback signal from the demodulator, which is more fully described hereafter.

Phase detector 148, filter 150, and voltage controlled oscillator 154 act in the above described phase lock loop manner whereby controlled oscillator output 158 is DC controlled via phase detector 148 through filter 150 such that its output frequency jumps in discrete intervals to phase lock with the crystal derived signal at phase detector first input 145. Since the crystal drive frequency is 200 Khz and its harmonics, the output on line 25b will jump in 200 Khz increments, which is the precise increment for proper FM tuning. Tuning control 20 applies a DC signal to voltage controlled oscillator input 155 whereby the oscillator output at 158 may step up or down in the desired increments over the preselected FM range.

The output from the divide by 5 first divider 142 couples to a second divider 160. The second divider divides input signals by 20 whereby the divider output is at 10 Khz, and its harmonics. These signals are in turn fed to the first input 161 of AM phase detector 163 which has a second input 162 and an output 164. The output feeds a low pass filter 165 which in turn feeds one of the voltage control inputs 166 of a voltage controlled oscillator 170. The voltage control output is at 175, this output being fed back to the phase detector second input 162.

The AM phase lock loop synthesizer works in a similar manner as the FM, the only difference being that the AM loop is tunable via line 173 from tuning control 20 in discrete steps of 10 Khz across the desired synthesizer output which appears on 25a.

It should be clear that either the preferred or alternate synthesizer may be modified to produce any desired mixing frequencies having any selected spacing increment, and thus, each is suitable to tune bands other than the AM/FM bands of the preferred radio embodiment. Moreover, because the stability of the synthesizer's output frequencies is dependent on the stability of the crystal, no AFC voltage need be derived as in prior art tuners. Thus the feedback from output 41 of the common IF 36 to input 42 of synthesizer 24, as illustrated in FIG. 1, is not required in the preferred embodiment employing a highly stable crystal controlled synthesizer.

An additional advantage of the embodiments of the synthesizer is that frequency compression feedback may be employed in the FM mode. Frequency compression feedback is a technique whereby the recovered base band information of a signal is fed back to, and FM modulates, the mixing frequency. This feedback is shown in FIG. 3A as applied to voltage controlled oscillator input 152, and in FIG. 3B as applied to voltage controlled oscillator 156. The resultant mixing frequency, when applied to the FM mixer, results in a reduced bandwidth signal at the mixer output since as the received RF signal increases in frequency deviation, the mixing frequency correspondingly increases. The reduced bandwidth mixer output allows a narrower bandpass in the IF filter. In conventional IF designs, the bandwidth is given as 2 ($\Delta f + f_m$), where $\Delta f$ is the maximum deviation and $f_m$ is the maximum modulating frequency. For stereo broadcast $\Delta f = 75$ Khz and $f_m = 53$ Khz. Thus, a conventional IF bandwidth is approximately 256 Khz. By using frequency compression feedback, the IF bandpass may be reduced to $2 \times f_m$ 33 106 Khz. A decrease in IF bandwidth results in a corresponding decrease in noise power. By reducing the noise a corresponding decrease in receiver threshold is realized. Threshold is that point at which the received signal's carrier can be distinguished above the noise level. Thus, by using frequency compression feedback the decreased threshold may be calculated:

Improved threshold in db = $10 \log_{10}(256/106)$ $\Phi 3.8$ db. With monophonic broadcast FM signals a further improvement in receiver threshold is possible because the base bandwidth is only 15 KHz.

Figure 4:
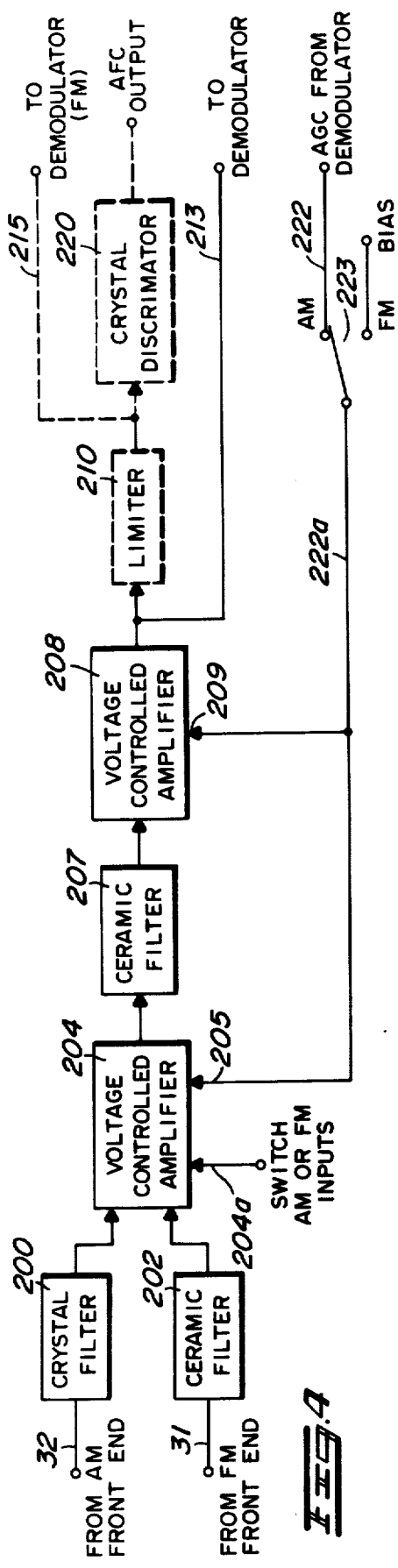
FIG. 4 is a detailed block diagram of the IF stage showing the common IF amplifier.

The output from the AM and FM front ends are fed to the IF section illustrated in FIG. 4. The AM mixer output 32 feeds to a crystal filter 200. The FM front end output 31 feeds to a ceramic filter 202. The outputs from the two filters 200, 202 are fed to a common IF amplifier 204 whose amplification is voltage controlled via voltage applied at a control terminal 205, via line 222a. A switch (not shown) internal to amplifier 204 is responsive to bandswitch signals on line 204a to selectively amplify and pass either the AM or FM input. The amplifier 204 output feeds to a ceramic filter 207 which in turn feeds to a second voltage controlled amplifier 208 also having a voltage control terminal 209 fed from line 222a.

Line 222a connects to the movable contact of a switch 223. Switch 223 is ganged with other band switches whereby in the AM mode line 222a connects to line 222, which is the AGC output from the demodulator, and in the FM mode line 222a connects to a bias potential. The bias potential is selected to operate the controlled amplifiers 204, 208 at maximum gain, whereby limiting of the FM signal is achieved. In the AM mode, however, AGC voltages from the demodulator maintain the controlled amplifiers 204, 208 in a linear range.

In an alternative embodiment, (shown in dashed lines), the output from the amplifier 208 feeds to limiter circuitry 210 and also to the AM demodulator via line 213. The limiter 210 acts to amplify and square input signals, thus providing an output at line 215 to the FM demodulator. The limiter 210 output is also shown feeding crystal discriminator 220 whose output is fed back to the voltage controlled oscillators (not shown) of the synthesizer 24. Due to the stability and accuracy of the crystal controlled synthesizer as used in the preferred embodiment, the discriminator is not required. However, in less stable synthesizer designs, or if conventional local oscillators are used, limiter 210 and discriminator 220 might provide improved circuit performance.

IF section operation is as follows. The crystal filter 200 has a very narrow pass band centered about the intermediate frequency, i.e. 10.7 MHz, which provides extensive AM selectivity. The selected AM signals are amplified in the amplifier 204, further filtered in the filter 207, and further amplified in amplifier 208 whereafter they are passed to the demodulator via line 213. Line 222 from the demodulator provides an automatic gain control signal which operates to keep the voltage controlled amplifiers 204, 208 in an amplification range whereby the AM signals are not distorted.

FM selectivity is accomplished through the action of ceramic filter 202, whose output is fed through the same amplifier 204, the same ceramic filter 207, and the same second amplifier 208, as was the AM signal. Since the fixed bias switched to line 222a, via switch 223, operates the amplifiers 204, 208 at maximum gain, FM limiting occurs.

By translating all front end signals to a common IF frequency it is seen that savings may be accomplished by utilizing common filters and amplifiers. Also, by translating the AM band up to a high IF frequency, the receiver's AM image rejection is improved.

An image is an unwanted frequency component received at the tuner's front end which is mixed to the same IF frequency as the desired signal. It can be shown that such an image is at a frequency twice the intermediate frequency removed from the desired RF signal. In conventional AM receivers, the AM pass band is translated to an IF frequency of 262.5 Khz. If, for example, the AM front end were tuned to 670 Khz, a local oscillator frequency of 932.5 Khz would produce the desired 262.5 Khz IF frequency. In addition, the local oscillator frequency would translate a received signal at 1195 Khz, which is still within the AM band, to the same IF frequency, thus creating detrimental interference with the desired signal. If a 10.7 Mhz translating frequency were used in the above example, a received interfering image would be at approximately 22.07 MHz. This signal would be well beyond the AM pass band, and would be attenuated by the preselection of the tuner to an extent that it would be negligible.

While all front end signals are translated to a single IF in the preferred embodiment, it should be understood that a radio according to the instant invention might employ a plurality of IF sections. A significant advantage is realized by up-converting the AM to any frequency by a translating frequency which is substantially greater than the frequency which is conventionally used to down-convert the AM. As described above, using a large translating frequency provides additional image rejection, and, thus, an improvement in the recovered AM signal. It is recommended, that, to realize the superior image rejection of an AM receiver according to the invention, the standard AM band of from 535–1605 Khz be translated by a modulating frequency to at least 7 MHz. The IF frequency of 10.7 MHz was chosen for the preferred embodiment since no potentially interfering broadcasting is allowed on this frequency.

Figure 5:
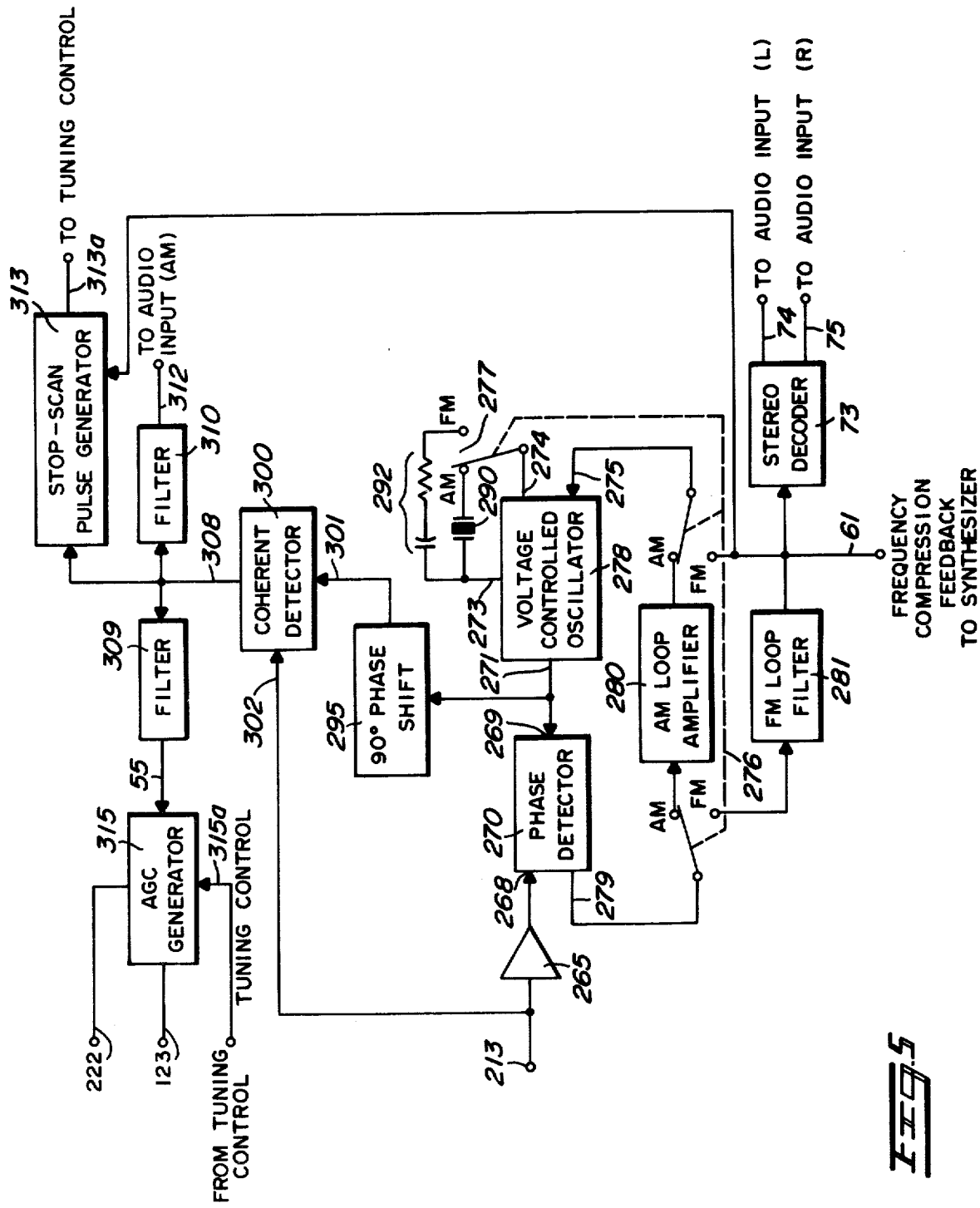
FIG. 5 is a detailed block diagram of the common phase lock loop demodulator.

The IF AM and FM output line 213 is fed to the demodulator, which is illustrated in FIG. 5. In the AM mode, IF signals on line 213 are routed first to an amplitude limiter 265, and thereafter to the first input 268 of a phase detector 270 which has a second input 269 and an output 279. The phase detector input 269 connects to the output 271 of a voltage controlled oscillator 278. The oscillator 278 has free running oscillator input terminals 273, 274, and a DC control terminal 275. A band switch 276, ganged with a switch 277, and switch 223 (FIG. 4), connects an AM loop amplifier 280 between the oscillator control terminal 275 and the phase detector output 279 in the AM mode, and an FM low pass filter 281 between these terminals in the FM mode. The switch 277 connects either a crystal 290 or an RC time constant circuit 292 between the free running oscillator terminals 273, 274 dependent upon whether the band switch is in the AM, or FM position, respectively. The voltage controlled oscillator output 271 connects to a 90° phase shift circuit 295 which then feeds to the first input 301 of a coherent detector 300. The detector's second input 302 connects to the input IF signal. Acting in the conventional manner, the coherent detector 300 demodulates the AM signal to base band via the injected phase locked carrier at input 301. The coherent detector output 308 feeds first to a first low pass filter 309 which in turn feeds an AGC generator 315 producing AGC control voltage on line outputs 222, 123, second to a second filter 310 whose output is the recovered audio which thereafter is fed to the AM audio input via line 312, and third to a stop scan pulse generator 313.

In the FM mode, IF signals on line 213 are limited by limiter 265 and applied to the first input, 268, of the phase detector 270. The FM detected output is taken at the voltage controlled oscillator 278 side of the FM loop filter, which thereafter feeds to a stereo decoder 73, to frequency compression feedback line 61, and to pulse generator 313. The stereo decoder has left channel and right channel outputs 74, 75 respectively, which feed to the audio inputs of the audio source selector.

Demodulator operation is understood as follows. For AM input signals, the entire AM IF signal is fed to one input 302 of the coherent detector 300. The voltage controlled oscillator 278 has the crystal 290 controlling its free running frequency, thus providing a very stable mode of oscillation at or near the intermediate frequency. The phase detector, voltage controlled oscillator, and AM loop amplifier cause the oscillator output 271 to phase lock to the IF frequency, thus reconstructing the broadcast carrier. This carrier is phase shifted 90° by the shift 295 for proper injection to the coherent detector 300. Operating in a well known manner, the coherent detector demodulates the IF AM signal to base band via the injected carrier. Several advantages can be gained over prior art envelope type detectors with the combination phase lock loop inject carrier and coherent detector. First, the resultant recovered signal is more stable during multipath conditions. Second, a decrease in noise of the recovered audio signal can be achieved. Third, the coherent detector is more linear than conventional detectors, thus yielding a lower distortion output. Also, in low signal conditions noise output from the detector is additive and not multiplicative to the recovered signal as in other systems, thus making the character of the received signal more pleasing to hear. Further, in small signal conditions where the carrier is prone to drop out, the phase lock loop injection scheme provides carrier "fill-in".

An increasing recovered audio signal from the detector 300 produces an increased signal from the output of filter 309, and thus, an increased control output signal from AGC generator 315 at line outputs 222, 123, which outputs gain reduce the IF voltage controlled amplifiers and front end attenuator. AGC generator 315 contains an integrator, such as a capacitor, which charges to a DC level representative of the magnitude of the recovered audio out of the coherent detector 300. Because radio tuning occurs rapidly, it is imperative that the integrator capacitor be discharged simultaneously with a tuning change. A pulse from the tuning control couples via line 315a to an AGC generator input whereby the AGC is disabled during the tuning mode. The stop-scan pulse generator 313 couples via line 131a to the tuning control. Contained within the stop-scan pulse generator 313 is a voltage reference which is compared with the average DC level of the recovered audio signal level. If the reference voltage is greater than the audio voltage, the pulse generator output line 313a remains mute, and the tuner sequences to a subsequent station. When the recovered audio average level exceeds the internal reference, a pulse is produced which signals the tuning control that a station is being received and that tuning should cease. AGC action tends to maintain the recovered audio signal at filter terminal output 312 at a constant level.

In the FM mode, the FM signal is fed through the limiter 265 to the phase detector 270. Due to the increased deviation in FM signals, the free running frequency of the local oscillator, as now determined by the network 292, is more easily "pulled". As the phase detector 270 constantly tries to lock to the input FM IF frequency, the voltage at the voltage controlled output 275 will in fact be the domodulated base band information. Such phase lock loop FM demodulator techniques are well known in the art, and are recognized as extending the FM threshold as well as producing a lower distortion output. This information is fed to the conventional stereo decoder 73 which produces a left output 74 and a right output 75. Also, the FM demodulated output at terminal 61 provides a frequency compression feedback signal to the synthesizer, which is more fully discussed with reference to FIGS. 3A, 3B. In addition, the recovered FM is fed to the stop-scan pulse generator 313, which produces stop pulses in response to minimum acceptable audio signals as in the similar manner as for AM signals.

Figure 6:
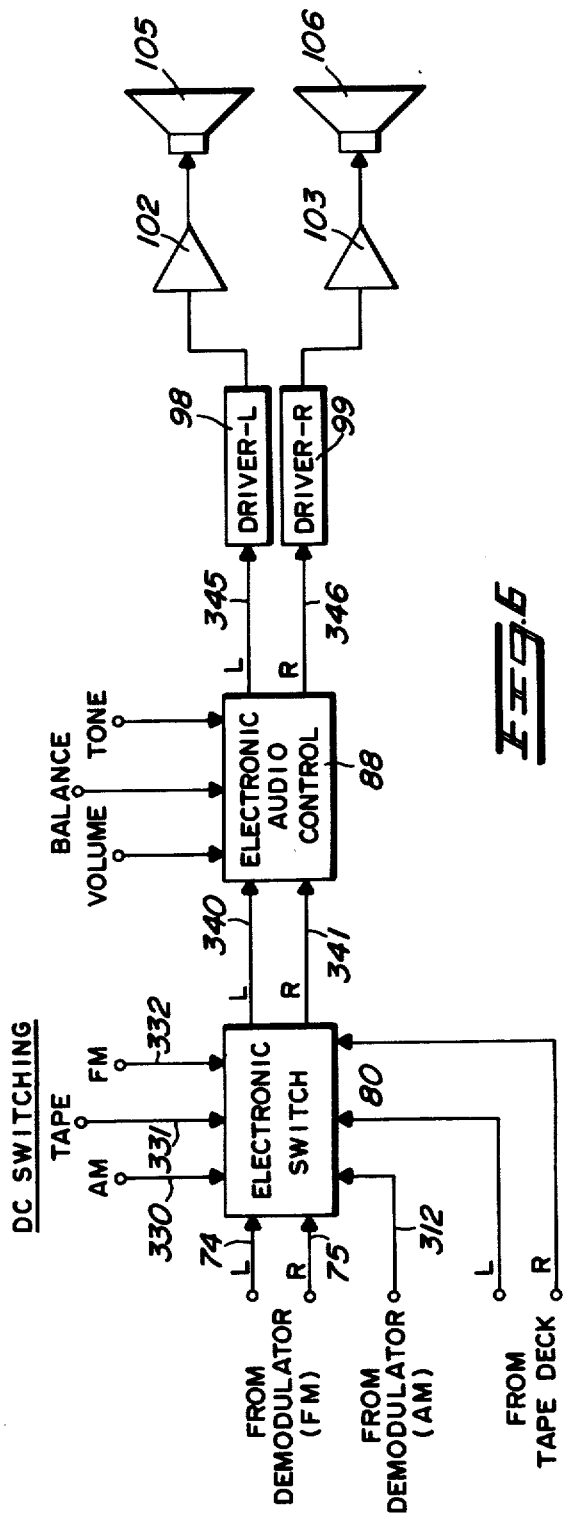
FIG. 6 is a detailed block diagram of the audio reproducing circuitry.

The left and right FM demodulated outputs 74, 75 respectively are fed to two of a plurality of inputs of an electronic switch source selector 80, as is shown in FIG. 6. Also, the AM demodulated output via line 312 is fed to one of the switch 80 inputs, as are the left and right outputs from a tape deck (not shown) which may be included within the electronic entertainment system. The switch 80 has a plurality of DC control inputs 330, 331, and 332. These inputs couple to panel selector switches (shown in FIG. 1), and when a reproduction mode, such as AM, is selected, an input signal is applied to a line 330-332 activating the electronic switch 80 whereby the selected input is routed to the electronic switch outputs 340 and 341. For example, when the FM mode is selected, a signal on line 332 activates the electronic switch 80 whereby the input lines 74, 75 are electronically switched to the corresponding outputs 340, 341.

The switch outputs 340, 341 couple to an electronic audio control 88. This control is responsive to DC signals applied via panel controls 94 (shown in FIG. 1) whereby the amplitude, tone, and balance of the channels are altered responsive to a change in the DC controls applied. Numerous DC controlled volume and tone systems are available, an example of which is U.S. Pat. No. 3,875,334 issued to Filliman and Hilbert, assigned to the same assignee as the instant invention. The resulting amplitude and tone shaped signals feed through output lines 345, 346 to the audio drivers 98, 99 which in turn, feed to the power amplifiers 102, 103, respectively. Amplifiers 98, 99 drive the speakers 105, 106, which thereby transduce the electrical signals to audibility.

Electronic switch 80 may be adapted to accept any number of input signals. Also, since the electronic audio control 88 is responsive to purely DC signals, the volume, balance, and tone controls may be located at a remote distance from the chassis of the radio receiver without degradation in the audio quality.

In summary, a universal electronic radio has been disclosed which consumes a minimum of space yet provides superior performance by drawing on state-of-the-art technology. Moreover, the design concept allows the entire radio to be fabricated on plug in modules adapted to be received within chassis connectors, thus rendering a readily repairable and alterable radio.

While a preferred embodiment of the present invention has been disclosed, many variations thereto are possible, all of which fall within the true spirit and scope of the invention.

I claim:

1. An electronic radio comprising
    a plurality of input RF front ends, including at least one AM front end and one FM front end, each front end including an RF filter tunable over a desired band to pass selected signals to its output,
    band switching means for selecting a desired front end output,
    means frequency variable to translate each selected front end output to a common predetermined intermediate frequency, which common intermediate frequency is selected to be substantially higher than the frequency of the AM front end signals;
    means tuning the front ends and the translator,
    means amplifying and filtering the intermediate frequency signal,
    means demodulating the signal from the intermediate frequency amplifying and filtering means, and
    audio reproducing means amplifying the demodulated output and transducing the resultant signal to audibility.

2. The radio of claim 1 wherein the AM RF filter of the AM front end includes a variable tuning circuit comprised of a saturable core reactor whose inductance predeterminedly varies in response to the selected tuning.

3. The radio of claim 2 wherein the tuner further comprises circuitry for providing a tuning current, having a predetermined voltage to current transfer function, to the reactor.

4. The radio of claim 1 wherein the FM RF filter of the FM front end includes a variable tuning circuit comprised of a reverse biased silicon diode whose capacitance predeterminedly varies in response to the selected tuning.

5. The radio of claim 1 wherein the translator includes a plurality of mixers and a frequency synthesizer,
    each mixer corresponding to one of the front ends and having a pair of inputs, an output, and internal circuitry producing at the output the modulated product of the two inputs, and
    the synthesizer having internal circuitry and a plurality of outputs each output coupled to a corresponding mixer second input, the internal circuitry producing at each output a signal having a frequency predeterminedly selected by the tuner, which frequency is suitable for translating the selected front end signal to the intermediate frequency.

6. The radio of claim 5 wherein the FM mixer internal circuitry comprises a MOSFET having first and second gates, a drain, and a source,
    the first gate corresponding to the first FM mixer input, the second gate corresponding to the second FM mixer input, the drain corresponding to the FM mixer output, and the source coupled to a reference potential.

7. The radio of claim 5 wherein the AM mixer internal circuitry comprises an FET having a gate, a source, and a drain,
    the gate corresponding to the first AM mixer input,
    the source corresponding to the second AM mixer input, and
    the drain corresponding to the AM mixer output.

8. The radio of claim 5 wherein the synthesizer comprises a crystal oscillator producing a predetermined frequency output, a first divider coupled to the crystal oscillator, producing at its output the signal at its input frequency divided by a first predetermined divisor, $N_1$, a second divider producing at its output the signal at its input frequency divided by a second predetermined divisor $N_2$, a third divider producing at its output the signal at its input divided by a modulus M, the third divider having internal circuitry responsive to control signals whereby the modulus M is programmable to selected values, a phase lock loop having a pair of phase detector inputs, and a voltage controlled oscillator having a DC control input and a controlled oscillator output, the output of the first divider coupled to the first phase detector input, the second and third dividers series connected from the oscillator output to the second phase detector input, the controlled oscillator output corresponding to a first synthesizer output and, the output from the second divider producing a second synthesizer output.

9. The radio of claim 8 wherein the synthesizer further comprises the crystal oscillator producing a 1 MHz output, the first divisor $N_1 = 20$, and the second divisor $N_2 = 20$.

10. The radio of claim 5 wherein the synthesizer comprises a crystal oscillator producing a predetermined frequency output, a first divider producing at its output the signal at its input frequency divided by a first predetermined divisor $N_1$, a second divider producing at its output the signal at its input frequency divided by a second predetermined divisor $N_2$, first and second phase lock loops, each having a phase detector input and a voltage controlled oscillator having a DC control input, and a controlled oscillator output, the crystal oscillator output coupled to the first divider input, the first divider output coupled to the input of the second divider and to the phase detector input of the first phase lock loop, the output of the second divider coupled to the phase detector input of the second phase lock loop, the first phase lock loop oscillator output corresponding to a first synthesizer output, and the second phase lock loop oscillator output corresponding to a second synthesizer output.

11. The radio of claim 10 wherein the synthesizer further comprises the crystal oscillator producing a 1 MHz output, the first divisor $N_1 = 5$, and the second divisor $N_2 = 20$.

12. The radio of claim 1 wherein the tuner comprises a manually controlled input, internal circuitry and a plurality of outputs, an output coupled to a corresponding front end and an output coupled to the translator, the internal circuitry responsive to the setting of the manual control for producing a predetermined signal at each output suitable for proper radio tuning.

13. The radio of claim 12 wherein the tuner further comprises means for storing and recalling selected manual control settings, means for manually selecting a stored setting and applying the same to the tuner internal circuitry.

14. The radio of claim 13 wherein the tuner further comprises means manually operable in a first mode to produce outputs suitable for scanning the selected band in an increasing frequency mode, and operable in a second mode to produce outputs suitable for scanning the selected band in a decreasing frequency mode.

15. The radio of claim 14 further comprising means responsive to a minimum detected output level to inhibit further scan.

16. The radio of claim 14 wherein the increasing and decreasing scan occurs at discrete frequency increments, which increments are preselected to tune the radio to precise predetermined frequencies.

17. The radio of claim 1 wherein the intermediate frequency amplifier and filter comprises a passband filter centered at the intermediate frequency series coupling the output of each selected and translated front end output to a common terminal, the common terminal coupled to the input of an IF amplifier.

18. The radio of claim 17 wherein the passband filter for each FM channel is a ceramic filter.

19. The radio of claim 17 wherein the IF amplifier further comprises a crystal discriminator, the discriminator producing an error signal representative of the difference between the frequency of signals applied to the IF amplifier and the predetermined intermediate frequency.

20. The radio of claim 19 further comprising means coupling the error signal back to the translator for correcting the translator output to more closely produce the predetermined intermediate frequency.

21. The radio of claim 5 further comprising feedback means coupling a predetermined portion of the demodulated FM output back to the internal circuitry of the synthesizer, whereby frequency compression is effected.

22. The radio of claim 1 wherein the demodulator further comprises:

a phase lock loop having a phase detector input and output and a local oscillator which has a voltage control terminal and which free runs at the intermediate frequency, means for coupling the signal from the intermediate frequency amplifying and filtering means to the phase detector input of the phase lock loop, a coherent detector having first and second inputs and an output, means for coupling the phase detector output to the coherent detector first input, means for coupling the output of the intermediate frequency amplifying and filtering means to the coherent detector second input, means responsive to the FM front end being selected to couple the phase lock loop voltage control terminal to the audio reproducing means, and means responsive to the AM front end being selected to couple the coherent detector output to the audio reproducing means.

23. The radio of claim 22 wherein the demodulator further comprises the FM output path leading to a stereo decoder.

24. The radio of claim 1 wherein the audio reproducing means comprises an audio source selector, the selector comprised of fully electronic switches responsive to manually operable controls in the radio to channel selected inputs to the selector output, and an audio processor having internal circuitry, the circuitry responsive to manually operable DC controls to predeterminedly alter the frequency and amplitude characteristics of selected output signals.

25. The radio of claim 1 further comprising digital display means sensing the status of the bandswitch and tuner and producing an illuminated readout representative of the radio tuning.

26. The radio of claim 25 further comprising an electronic clock with means to switch either the clock output or the radio output to the digital display whereby radio tuning or time is displayable.

27. The radio of claim 25 further comprising a tape deck and including sensing means operable to activate the display to represent tape deck status and further comprising means to switch either the radio or the sensing means to the display.

28. The radio of claim 1 including a chassis having interconnected module receiving connectors and further comprising a plurality of modules, each module containing selected radio circuitry.

29. An electronic radio comprising a plurality of input RF front ends, including at least one AM front end and one FM front end, each front end including an RF filter tunable over a desired band to pass selected signals, each FM filter including a reverse biased silicon diode whose tuning capacitance varies predeterminedly in response to a tuning signal, each AM filter including a saturable reactor whose tuning inductance varies predeterminedly in response to a tuning signal, each AM front end further including a voltage controlled attenuator connected in series therewith for controlling the output amplitude level of the AM front end;

band switching means operable to pass the signal from a selected front end, means frequency variable to translate each selected front end output to a common predetermined intermediate frequency including a plurality of mixers, each mixer corresponding to one of the front ends and having a pair of inputs, an output, and internal circuitry for producing at the output the modulated product of the two inputs, and a synthesizer having internal circuitry and a plurality of outputs, each output coupled to a corresponding mixer second input, the internal circuitry responsive to a tuning signal to produce at each output a signal, of a predetermined frequency, which is suitable for translating the selected front end signal to the intermediate frequency, means tuning the front ends and translator comprising a manually operable control, internal circuitry, and a plurality of outputs, selected outputs coupling to corresponding front end filters, a selected output coupled to the internal circuitry of the synthesizer, the synthesizer internal circuitry responsive to the manual control to produce a predetermined tuning signal at each output suitable for proper radio tuning, means amplifying and filtering the intermediate frequency signal in a predetermined manner, means demodulating the signal from the intermediate frequency amplifying and filtering means, the demodulator using a phase lock loop to demodulate FM signals and using the phase lock loop and a coherent detector to demodulate AM signals, manually operable DC controls;

audio reproducing means amplifying the demodulated output and transducing the amplified signal to audibility including internal circuitry which is responsive to the manually operable DC controls to predeterminedly alter the frequency and amplitude characteristics of the amplified signal, and a digital display means sensing the status of the band switch and tuner and producing an illuminated readout representative of the radio tuning.

30. The radio of claim 29 wherein the synthesizer comprises a crystal oscillator producing a predetermined frequency output, a first divider, coupled to the crystal oscillator, producing at its output the signal at its input frequency divided by a first predetermined divisor $N_1$, a second divider producing at its output the signal at its input frequency divided by a second predetermined divisor $N_2$, a third divider producing at its output the signal at its input divided by a modulus M, the third divider having internal circuitry responsive to tuning signals whereby the modulus M is programmable to selected values, a phase lock loop having a pair of phase detector inputs, and a voltage controlled oscillator having a DC control input and a controlled oscillator output, the output of the first divider coupled to the first phase detector input, the second and third divider series connected from the oscillator output to the second phase detector input, the controlled oscillator output corresponding to a first synthesizer output and, the output from the second divider producing a second synthesizer output.

31. The radio of claim 30 wherein the synthesizer further comprises the crystal oscillator producing a 1 MHz output, the first divison $N_1 = 20$, and the second divison $N_2 = 20$.

32. The radio of claim 29 wherein the synthesizer comprises a crystal oscillator producing a predetermined frequency output, a first divider producing at its output the signal at its input divided by a first divisor $N_1$, a second divider producing at its output the signal at its input divided by a second divider $N_2$, first and second phase lock loops, each having a phase detector input, a voltage controlled oscillator, a DC control input, and a controlled oscillator output, the crystal oscillator output coupled to the first divider input, the first divider output coupled to the input of the second divider and to the phase detector input of the first phase lock loop, the output of the second divider coupled to the phase detector input of the second phase lock loop, the first phase lock loop oscillator output corresponding to a first synthesizer output, and the second phase lock loop oscillator output corresponding to a second synthesizer output.

33. The radio of claim 29 wherein the tuner further comprises means for storing and recalling selected manually operable control settings, and means for manually selecting a stored setting and applying the same as a tuning signal to tune the radio to a selected frequency.

34. The radio of claim 29 wherein the tuner further comprises means manually operable in a first mode to produce outputs suitable for scanning the selected band at an increasing frequency mode, and operable in a second mode to produce outputs suitable for scanning the selected band in a decreasing frequency mode.

35. The radio of claim 34 further comprising means responsive to a minimum detected output level to inhibit further scan.

36. The radio of claim 34 wherein the increasing and decreasing scan occurs at discrete frequency increments, which increments are preselected to tune the radio to precise predetermined frequencies.

37. The radio of claim 29 wherein the tuner further comprises circuitry, having a predetermined voltage to current transfer function, for providing a tuning current to the saturable core reactors.

38. The radio of claim 29 wherein the IF amplifier further comprises a crystal discriminator, the discriminator producing an error signal representative of the difference between the frequency of signals applied to the IF amplifier and the predetermined intermediate frequency.

39. The radio of claim 29 further comprising means coupling the error signal back to the translator for correcting the translator output to more closely produce the predetermined intermediate frequency.

40. The radio of claim 29 further comprising feedback means coupling a predetermined portion of the demodulated FM output back to the internal circuitry of the synthesizer, whereby frequency compression is effected.

41. The radio of claim 29 wherein the audio reproducing means comprises an audio source selector, the selector comprised of fully electronic switches responsive to manually operable controls in the radio to selectively channel selected inputs to the selector output.

42. The radio of claim 29 further comprising an electronic clock with means to switch either the clock output or the radio to the digital display whereby radio tuning or time is displayable.

43. The radio of claim 29 further comprising a tape deck and including sensing means operable to activate the display to represent tape deck status and further comprising means to switch either the radio or the sensing means to the display.

44. The radio of claim 29 including a chassis and radio circuits wherein selected circuits are fabricated on plug in modules and the chassis has a plurality of module plug in connectors, each connector corresponding to a given radio function, the connectors interconnected in a predetermined manner determined by the particular function each represents.

45. The front end of an FM/AM tuner comprising first circuit means passing selected frequencies in the FM band,
second circuit means passing selected frequencies in the AM band,
third circuit means translating the selected frequencies in each band to a common intermediate frequency, said common intermediate frequency selected to be substantially higher than the selected frequencies of the AM band, and
means selecting the frequencies to be passed and translated.

46. The tuner front end of claim 45 wherein the first circuit means comprises a first RF filter having an input, an output, a control terminal, and a variable tuning circuit, the circuit passing predetermined FM frequencies at the input to the output responsive to selected signals at the control terminal.

47. The tuner front end of claim 46 wherein the variable tuning circuit is comprised of a reverse biased silicon diode in circuit configuration to predeterminedly change tuning capacitance responsive to selected DC control terminal signals.

48. The tuner front end of claim 45 wherein the second circuit means comprises a second RF filter having an input, an output, a control terminal, and a variable tuning circuit, the circuit passing predetermined AM frequencies at the input to the output responsive to selected signals at the control terminal.

49. The tuner front end of claim 48 wherein the variable tuning circuit is comprised of a saturable core reactor in circuit configuration to predeterminedly change tuning inductance responsive to selected DC control terminal signals.

50. The tuner front end of claim 45 wherein the translator means includes an FM mixer, an AM mixer, and a frequency synthesizer,
each mixer having a pair of inputs, an output, and internal circuitry, the internal circuitry producing at the output the modulated product of the two inputs,
the synthesizer having internal circuitry and a pair of outputs, the internal circuitry producing at its first output signals of selected frequencies suitable for translating FM band signals to a predetermined intermediate frequency,
the internal circuitry producing at its second output signals of selected frequencies suitable for translating AM band signals to the predetermined intermediate frequency,
the FM mixer having its first input coupled to the first circuit means output, the AM mixer having its first input coupled to the second circuit means output,
the synthesizer first output coupled to the FM mixer second input, and
the synthesizer second output coupled to the AM mixer second input.

51. The tuner front end of claim 50 wherein the FM mixer internal circuitry comprises an MOSFET having first and second gates, a drain, and a source,
the first gate corresponding to the first FM mixer input, the second gate corresponding to the second FM mixer input, the drain corresponding to the FM mixer output, and the source coupled to a reference potential.

52. The tuner front end of claim 50 wherein the AM mixer internal circuitry comprises an FET having a gate, a source, and a drain,
the gate corresponding to the first AM mixer input,
the source corresponding to the second AM mixer input, and
the drain corresponding to the AM mixer output.

53. The tuner of claim 50 wherein the synthesizer comprises
a crystal oscillator producing a predetermined frequency output, a first divider, coupled to the crystal oscillator, producing at its output the signal at its input frequency divided by a first divisor $N_1$, a second divider producing at its output the signal at its input frequency divided by a second divisor $N_2$, a third divider producing at its output the signal at its input divided by a modulus M, the third divider having internal circuitry responsive to control signals whereby modulus M is programmable to selected values, a phase lock loop having a pair of phase detector inputs, and a voltage controlled oscillator having a DC control input and a controlled oscillator output, the output of the first divider coupled to the first phase detector input, the second and third divider series connected from the controlled oscillator output to the second phase detector input, the controlled oscillator output corresponding to the first synthesizer output and, the output from the second divider producing the second synthesizer output.

54. The tuner of claim 53 wherein the synthesizer further comprises the crystal oscillator producing a 1 MHz output,
the first divisor $N_1 = 20$, and
the second divisor $N_2 = 20$.

55. The tuner front end of claim 50 wherein the synthesizer comprises a crystal oscillator producing a predetermined frequency output, a first divider producing at its output the signal at its input divided by $N_1$, a second divider producing at its output the signal at its input divided by $N_2$, a first and second phase lock loops, each having a phase detector input, a voltage controlled oscillator, a DC control input, and a controlled oscillator output, the crystal oscillator output coupled to the first divider input, the first divider output coupled to the input of the second divider and to the phase detector input of the first phase lock loop, the output of the second divider coupled to the phase detector input of the second phase lock loop, the first phase lock loop oscillator output corresponding to the first synthesizer output, and the second phase lock loop oscillator output corresponding to the second synthesizer output.

56. The tuner front end of claim 55 wherein the synthesizer further comprises the crystal oscillator producing a 1 MHz output,
the first divisor $N_1 = 5$, and
the second divisor $N_2 = 20$.

57. The front end of an FM/AM tuner comprising an FM RF filter having an input and an output, the input receiving RF signals, the filter tunable to pass selected frequencies in the FM band to the output, an FM mixer having first and second inputs and an output, the mixer producing at its output the modulated product of its inputs, the first mixer input coupled to the FM RF output, an FM local oscillator having its output coupled to the FM mixer second input, the FM local oscillator tunable over a range of frequencies selected to translate the selected FM frequencies to a predetermined intermediate frequency, an AM RF filter having an input and an output, the input receiving RF signals, the filter tunable to pass selected frequencies in the AM band to the output, an AM mixer having first and second inputs and an output, the mixer producing at its output the modulated product of its inputs, means coupling the output of the AM RF filter to the first input of the AM mixer, and an AM local oscillator having its output coupled to the AM mixer second input, the AM local oscillator tunable over a range of frequencies selected to translate the AM selected frequencies to the predetermined intermediate frequency.

* * * * *